United States Patent [19]
Sanders

[11] Patent Number: 5,273,940
[45] Date of Patent: Dec. 28, 1993

[54] MULTIPLE CHIP PACKAGE WITH THINNED SEMICONDUCTOR CHIPS

[75] Inventor: Paul W. Sanders, Scottsdale, Ariz.

[73] Assignee: Motorola, Inc., Schaumburg, Ill.

[21] Appl. No.: 898,646

[22] Filed: Jun. 15, 1992

[51] Int. Cl.⁵ .............................................. H01L 21/60
[52] U.S. Cl. .................... 437/209; 437/211; 437/217; 437/220; 437/225; 437/974
[58] Field of Search .............. 437/209, 211, 217, 220, 437/207, 974, 225; 148/DIG. 135

[56] References Cited

U.S. PATENT DOCUMENTS

| | | | |
|---|---|---|---|
| 4,432,131 | 2/1984 | Sadamasa et al. | 437/211 |
| 4,530,152 | 7/1985 | Roche et al. | 437/211 |
| 4,635,356 | 1/1987 | Ohuchi et al. | 437/209 |
| 4,999,319 | 3/1991 | Hamano et al. | 437/204 |
| 5,001,075 | 3/1991 | Boland et al. | 437/33 |
| 5,081,067 | 9/1992 | Shimizu et al. | 437/217 |
| 5,155,068 | 10/1992 | Tada | 437/211 |

*Primary Examiner*—Brian E. Hearn
*Assistant Examiner*—Kevin M. Picardat
*Attorney, Agent, or Firm*—Gary W. Hoshizaki

[57] ABSTRACT

An assembly is formed by coupling a plurality of semiconductor chips (26–29) to a surface of a substrate (17). An encapsulation material (22) is placed on the surface of the substrate (17) to protect the semiconductor chips (26–29) from an external environment. Material is removed from the plurality of semiconductor chips (26–29) to thin each semiconductor chip (26–29) to promote thermal conductivity.

20 Claims, 3 Drawing Sheets

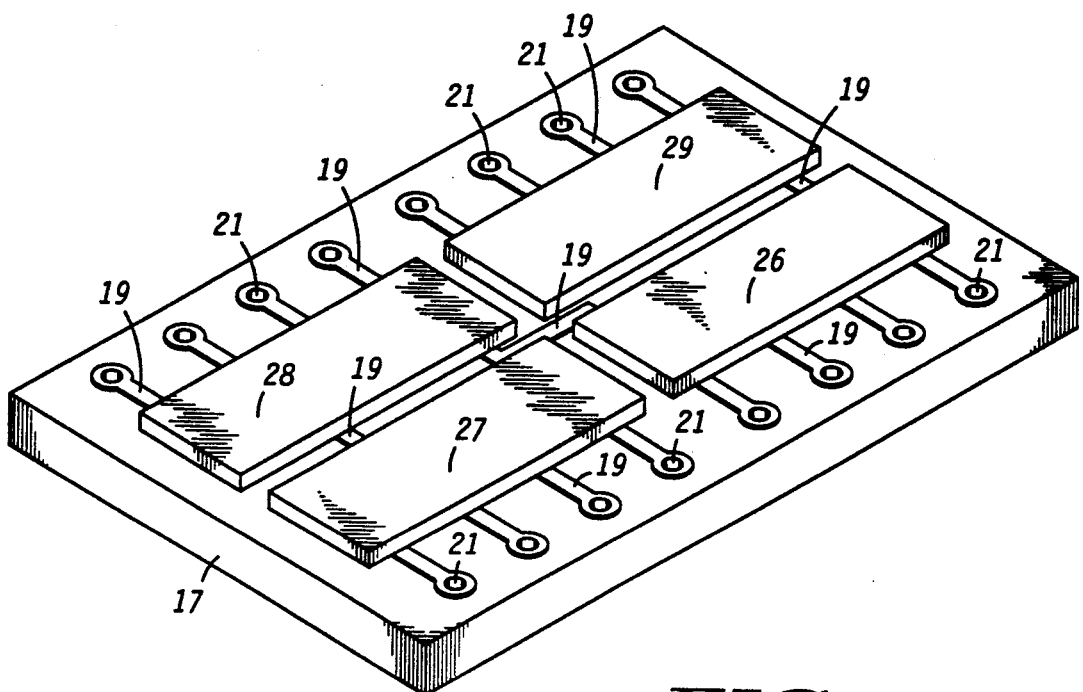
FIG. 3
FIG. 5
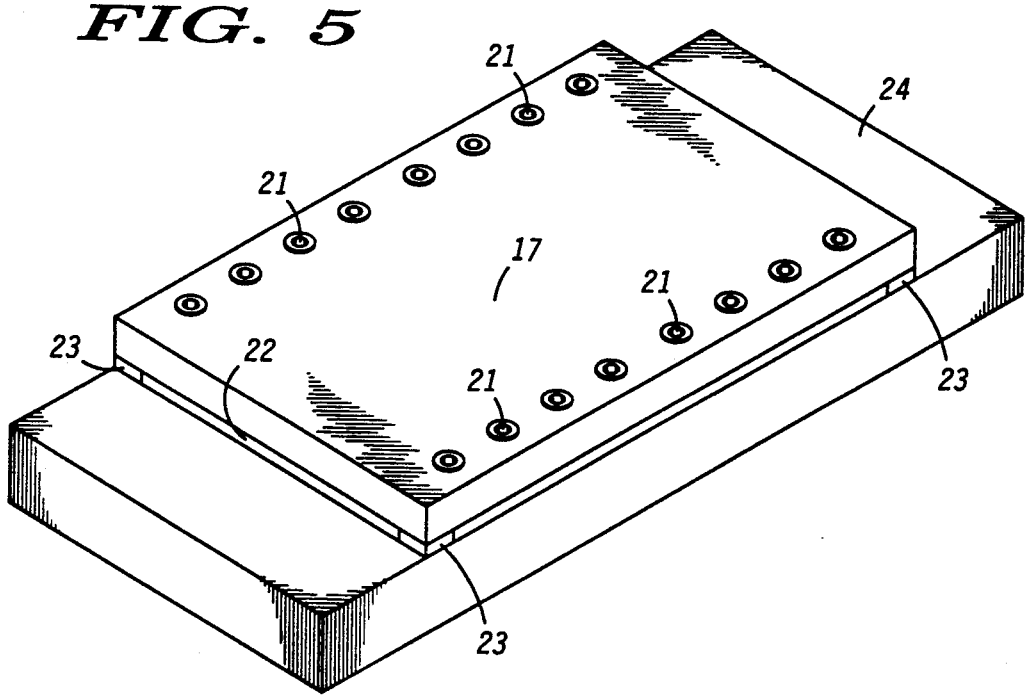

MULTIPLE CHIP PACKAGE WITH THINNED SEMICONDUCTOR CHIPS

BACKGROUND OF THE INVENTION

This invention relates, in general, to semiconductor chip packages, and more particularly to semiconductor packages housing a plurality of thinned semiconductor chips to promote heat dissipation.

Semiconductor manufacturers are continually developing semiconductor chips which are faster and deliver more power to a load. Increasing the speed of a semiconductor device while increasing the power it can deliver are difficult tasks to achieve simultaneously. Other hurdles must be overcome which impact performance even if a processing flow can be developed which meets both speed and power requirements.

One of the main problems in increasing speed and power of a device is the removal of heat generated by the semiconductor chip. High operating temperatures reduce electron and hole mobilities while increasing parasitic resistance values, thereby reducing device performance. It is imperative to operate semiconductor chips at as low a temperature as possible if performance is a critical factor. Semiconductor materials are generally poor thermal conductors, this makes heat removal a difficult process. To promote thermal transfer in high performance semiconductor chips, semiconductor wafers are made as thin as possible. The less semiconductor material the heat has to pass through, the faster it can be removed from the semiconductor chip. Bulk semiconductor wafers purchased to form semiconductor chips are not thin enough to provide adequate thermal transfer. Material is removed by either grinding, chemically thinning, or both to produce a thin semiconductor wafer.

Typically, semiconductor wafer thinning is accomplished during final wafer processing to minimize handling of a thin semiconductor wafer. A thinned semiconductor wafer is extremely fragile. Although at the end of a wafer process cycle, a thinned semiconductor wafer still goes through many wafer process steps in which it must be handled. Final semiconductor chip yields can be impacted severely due to wafer breakage at these final stages. Losing a semiconductor wafer at this stage has additional costs because all the wafer processing steps have been completed. It would be of great benefit if a method could be developed which eliminates handling of the thinned semiconductor wafers thereby increasing wafer yields and lowering manufacturing costs.

SUMMARY OF THE INVENTION

Briefly stated, this invention is a method for forming a semiconductor chip package which has a plurality of semiconductor chips which are reduced in thickness during the formation of the semiconductor chip package thereby eliminating the need to handle thinned semiconductor chips. The plurality of semiconductor chips are coupled to a surface of a substrate. An encapsulation material is placed on the surface of the substrate to protect the surface from exposure to an external environment. Material is removed from the plurality of semiconductor chips to reduce semiconductor chip thickness thereby increasing thermal conductivity of each semiconductor chip.

BRIEF DESCRIPTION OF THE DRAWINGS

FIG. 3 is an illustration of a plurality of semiconductor chips coupled to a substrate;

FIG. 5 is an illustration of a multiple chip package having thinned semiconductor chips and a heatsink.

DETAILED DESCRIPTION OF THE DRAWINGS

Figure 1:
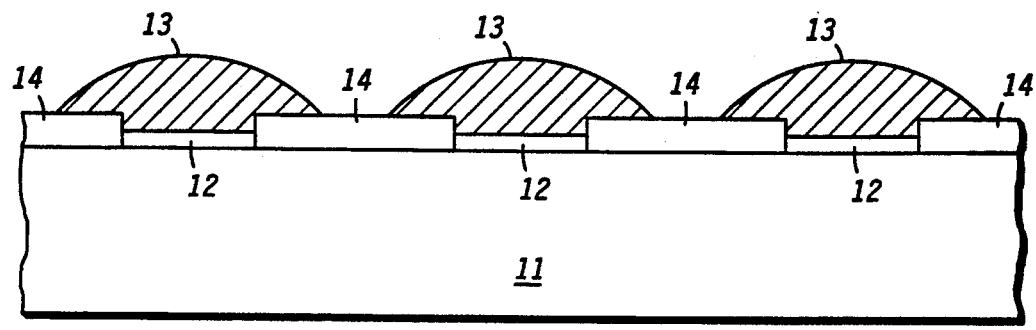
FIG. 1 is a cross-sectional view of a substrate illustrating a formation of a plurality of metal bumps.

FIG. 1 is a cross-sectional view of a plurality of metal bumps 13 formed on a substrate 11.

Plurality of metal bumps 13 serve as a coupling means for electrically and physically connecting a semiconductor chip to a substrate. In the preferred embodiment of the multiple chip package with thinned semiconductor die a plurality of semiconductor chips are coupled to the substrate. Metal bumps can be formed on each of the plurality of semiconductor chips or on the substrate. The choice on which surface to place metal bumps is typically based on manufacturing requirements.

In the preferred embodiment, substrate 11 is a semiconductor chip substrate. A plurality of contact pads 12 are formed on substrate 11. Metal interconnect connects signal or power lines from circuitry on substrate 11 to plurality of contact pads 12. Plurality of contact pads 12 are interconnect points which couple to a plurality of corresponding substrate contact pads formed on a different substrate.

In the preferred embodiment, each contact pad is formed from gold or a surface of each contact pad is plated with gold. Gold has extremely good conductive qualities which is critical for circuitry operating at high speeds. Performance can be severely degraded if parasitic resistance and inductance of interconnect which couples plurality of contact pads 12 to external elements is not minimized.

Plurality of metal bumps 13 are formed on plurality of contact pads 12. Photoresist 14 is used to mask off all areas on substrate 11 other than plurality of contact pads 12. Photoresist prevents metallization of areas on substrate 11. In the preferred embodiment, plurality of metal bumps 13 are made of gold. An electroplating process is used to form plurality of metal bumps 13 on plurality of contacts 12. Electroplated gold will adhere to each contact pad 12 since plurality of contact pads 12 are made of gold or the surface of each contact pad 12 is plated with gold. Electroplating metal has three properties which is critical to forming the multiple chip package. First, electroplating is a well known process which can be implemented in a production environment where throughput is important. Second, electroplating can be accomplished at room temperatures (approximately 25 degrees Celsius). The low temperatures involved with the electroplating process will not promote failures or damage a semiconductor chip. Finally, metal bump growth can be controlled accurately. Gold metal bumps formed by electroplating are grown to a height of approximately 12.7 microns. Variations in gold metal bump height have been measured at plus or minus 1.3 microns. Controlling metal bump height to this accuracy insures each metal bump will adequately contact a corresponding substrate contact pad. Photoresist 14 is removed after the electroplating process has been completed and plurality of metal bumps 13 have been formed.

Although electroplating gold is the preferred embodiment of forming a metal bump other types of metal bumps will also perform adequately. The most common metal bump used is a solder bump. The size and height of a solder bump can be accurately controlled but formation of the solder bump occurs at a temperature needed to make the solder flow. Also, conductive properties of solder may not be good enough for high end applications where performance is critical. Solder bumping is a good solution to minimize costs in manufacturing a multiple chip package.

Figure 2:
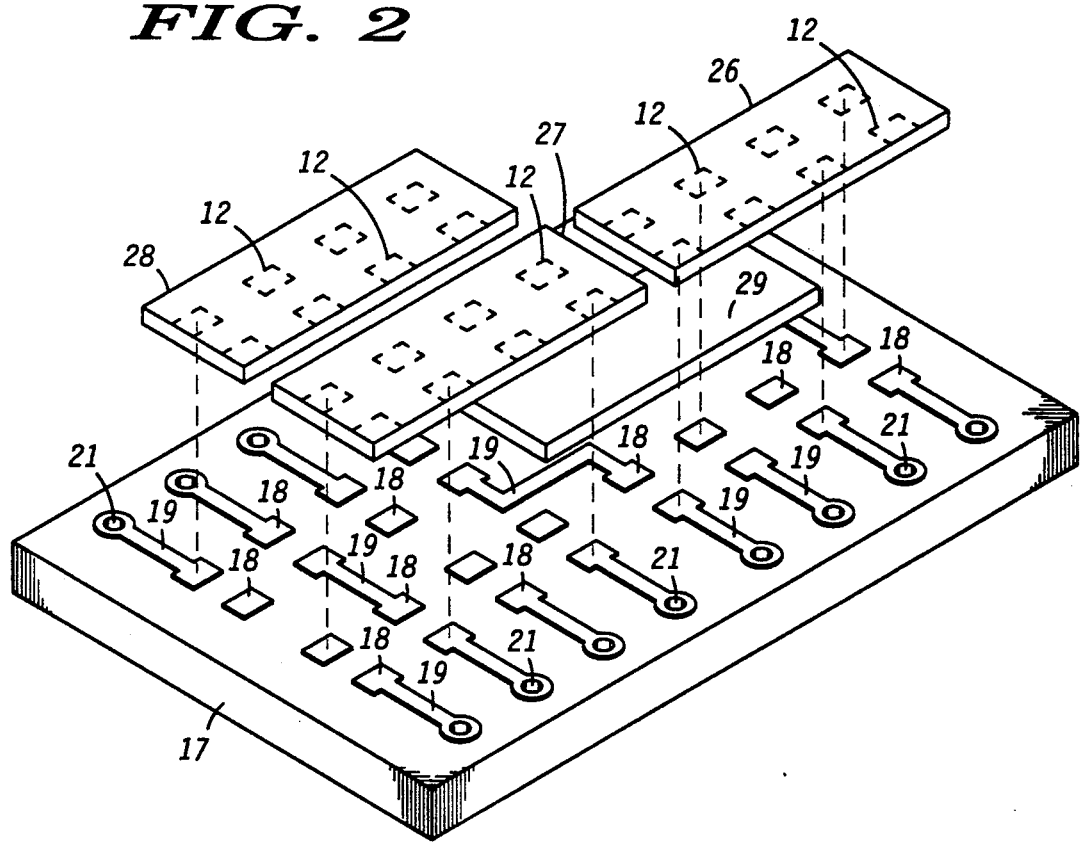
FIG. 2 is an illustration of a plurality of semiconductor chips aligned to a substrate.

FIG. 2 is an illustration of a plurality of semiconductor chips 26, 27, 28, and 29 aligned for coupling to a substrate 17.

Each semiconductor chip 26–29 has a plurality of contact pads 12. A metal bump (as described in FIG. 1) is formed on each contact pad 12 of each semiconductor chip 26–29. Semiconductor chips 26–29 are to be mounted on substrate 17. FIG. 2 is simplified for illustration purposes. The number and placement of plurality of contact pads 12 on each semiconductor chip (26–29) will vary depending on semiconductor chip size and circuitry placed on each chip. Also, the number of chips which can be placed on substrate 17 and the density in which they can be placed depends significantly on the interconnect technology used on substrate 17. It should be noted that each semiconductor chip (26–29) is of standard thickness (approximately 508 microns thick for a semiconductor wafer having a 7.62 centimeter diameter) and each has not been thinned. This allows standard semiconductor chip handling procedures to be used without fear of breakage.

Substrate 17 serves to support and interconnect plurality of semiconductor chips 26–29. Placing plurality of semiconductor chips 26–29 on a common substrate minimizes interconnect distance between semiconductor chips, enhancing performance, while minimizing the area or space the circuitry would take up when placed in a component system. Substrate 17 can be formed from a multitude of materials such as organic materials, ceramics, or semiconductor materials. Material choice is usually a function of specific circuitry requirements and manufacturing concerns. Substrate 17 must provide adequate support, have interconnect to couple semiconductor chips together, and have a uniform thickness. In the preferred embodiment, substrate 17 is an aluminum oxide substrate. Aluminum oxide is a ceramic material which meets the minimum requirements listed above. A preferred thickness for substrate 17 is approximately 1524 microns.

Substrate 17 has a plurality of substrate contact pads 18 for coupling to plurality of contact pads 12 on each semiconductor chip (26–29). In the preferred embodiment, each contact pad 12 of each semiconductor chip (26–29) has a corresponding substrate contact pad on substrate 17. Plurality of contact pads 12 of each semiconductor chip (26–29) corresponding to a plurality of substrate contact pads 18 physically align to one another as illustrated by dotted lines in FIG. 2. Each semiconductor chip (26–29) can be aligned and lowered so that plurality of metal bumps 13 (FIG. 1) couple plurality of contact pads 12 to a corresponding plurality of substrate contact pads 18. Semiconductor chip 29 is shown lowered and coupled to substrate 17. In the preferred embodiment, circuitry is formed on the same side of a semiconductor chip as the contact pads. When each semiconductor chip (26–29) is coupled to substrate 17 only a backside of each semiconductor chip (26–29) is exposed.

Substrate 17 has a metal interconnect layer 19 used for coupling circuitry together. Also illustrated are a plurality of metal plated openings 21. Metal plated openings 21 are conductive paths through substrate 17 to allow connections to circuitry from a side opposite from which plurality of semiconductor chips 26–29 are mounted. Metal plated openings 21 reduce distance needed to interconnect circuitry on substrate 17 to other external elements.

FIG. 3 is an illustration of each semiconductor chip (26–29) aligned and lowered to substrate 17.

Gold metal bumps 13 (FIG. 1) formed on each contact pad on each semiconductor chip couples to a corresponding substrate contact pad on substrate 17. An assembly comprising substrate 17 and plurality of semiconductor chips 26–29 is formed by heating the assembly. The assembly is heated to a temperature between 370 and 380 degrees Celsius. At this temperature gold metal bumps 13 will soften enough to bond to the gold surface or gold substrate contact pad of a corresponding substrate contact pad. This process fastens each semiconductor chip (26–29) to substrate 17 as well as physically and electrically connecting each contact pad 12 (FIG. 2) to a corresponding substrate contact pad.

Figure 4:
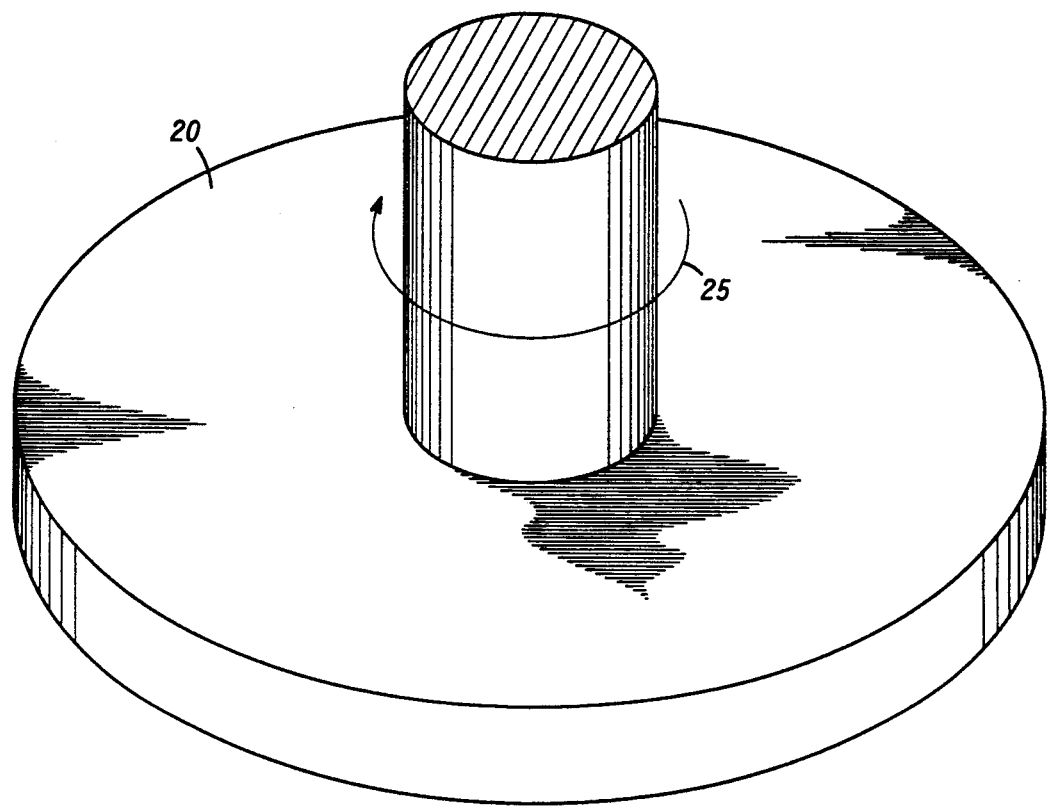
FIG. 4 is an illustration of an assembly having material removed to thin a plurality of semiconductor chip.
Figure 4:
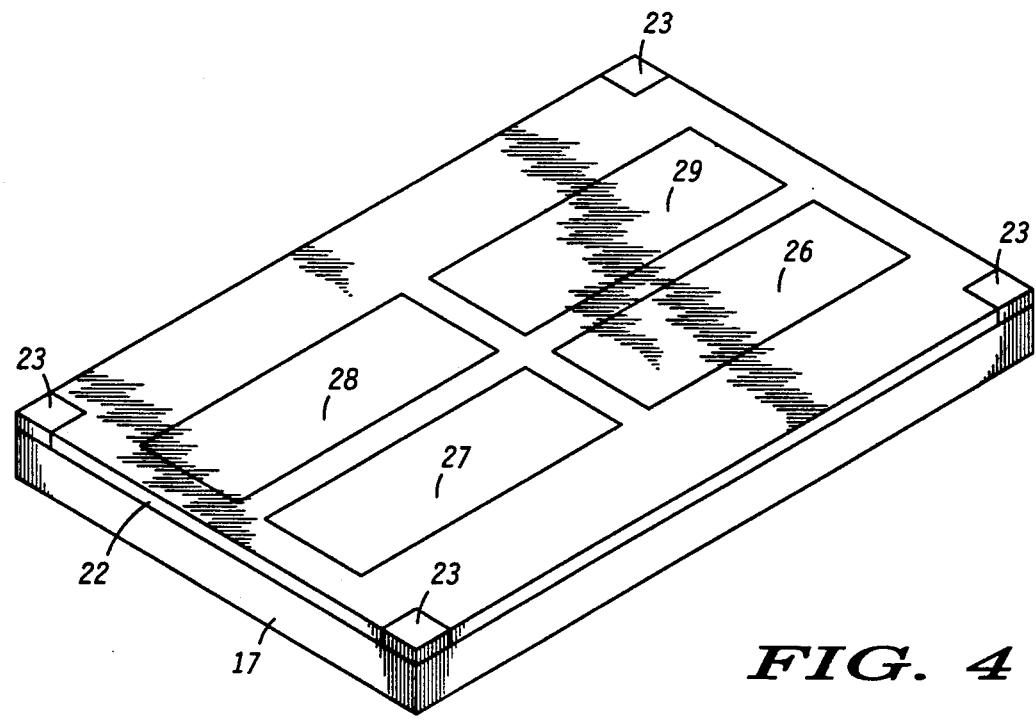

FIG. 4 is an illustration of the assembly where material has been removed to thin plurality of semiconductor chips 26–29 to promote thermal conductivity.

As mentioned previously each semiconductor chip (26–29) was not thinned prior to mounting to substrate 17 thereby allowing standard handling practices for semiconductor chips to be used. Once mounted a plurality of metal stops 23 are fastened to substrate 17. Plurality of metal stops 23 are designed to a predetermined height to indicate when plurality of semiconductor chips 26–29 have had enough material removed.

An encapsulation material 22 is then placed on substrate 17 to protect semiconductor chips 26–29 and the interconnection to substrate 17 from an external environment. Encapsulation material 22 surrounds semiconductor chips 26–29 further insuring that circuitry on each semiconductor chip is not exposed. In the preferred embodiment, encapsulation material 22 is an epoxy. Encapsulation material 22 also serves a secondary function of further fastening each semiconductor chip 26–29 to substrate 17.

A rotating grinding disk 20 is used to remove material from the assembly. Rotation of grinding disk 20 is indicated by arrow 25. Grinding disk 20 removes material from the backside of each semiconductor chip 26–29 (and encapsulation material 22) until grinding disk 20 contacts plurality of metal stops 23 which indicates that the grinding process should halt. In the preferred embodiment, each semiconductor chip 26–29 started with a thickness of approximately 508 microns. After grinding each semiconductor chip 26–29 has a thickness of approximately 114.3 to 127 microns. The reduced thickness of each semiconductor chip (26–29) greatly increases their ability to dissipate heat.

For some applications it may be necessary to apply a layer of metal on the backside of semiconductor chips 26–29. The assembly can be placed in a metal sputtering chamber allowing metal to be applied to the backside of semiconductor chips 26–29.

FIG. 5 is an illustration of a multiple chip package having thinned semiconductor chips.

After thinning the assembly, a heatsink 24 is coupled to plurality of semiconductor chips 26-29 (FIG. 4). In the preferred embodiment, heatsink 24 is made from copper. An intermediate material is placed between the assembly and heatsink 24 to maximize thermal conductivity from plurality of semiconductor chips 26-29 to heatsink 24. In the preferred embodiment, the intermediate material is a solder which also bonds heatsink 24 to the assembly. The solder serves as a thermal conducting means to transfer heat from semiconductor chips 26-29 to heatsink 24. Alternate intermediate materials are malleable metal foils or thermal conductive pastes. For the alternate intermediate materials other methods are needed to hold heatsink 24 to the assembly such as a clamp or screws. Heat sink 24 and substrate 17 protect plurality of semiconductor chips 26-29 from exposure to an external environment.

Also illustrated in FIG. 5 are plurality of metal plated openings 21. Plurality of metal plated openings 21 are easily accessible for connecting the assembly to other circuitry or external elements.

By now it should be appreciated that a multiple chip package having thinned semiconductor chips has been shown. The multiple chip package is designed to eliminate the need for handling individual thinned semiconductor die which are extremely fragile and prone to breakage. Multiple chips are interconnected on a substrate, thinned, and heat sinked to increase circuit performance. Interconnection distance from the multiple chip package is reduced by allowing access to the multiple chips on a side of the multiple chip package.

I claim:

1. A method for forming a multiple chip package with thinned semiconductor chips comprising:
   providing a plurality of semiconductor chips, each semiconductor chip having a plurality of contact pads;
   providing a substrate;
   forming a plurality of substrate contact pads on the substrate for each semiconductor chip wherein each semiconductor chip has a corresponding plurality of contact pads which physically align to the substrate contact pads;
   forming a gold bump on each contact pad on each semiconductor chip, wherein each gold bump has a substantially similar height;
   coupling each semiconductor chip to the substrate by mating the gold bumps on a semiconductor chip to a corresponding substrate contact pad on the substrate;
   placing an encapsulating material on the substrate to surround the semiconductor chips while leaving a portion of the semiconductor chips exposed;
   removing exposed semiconductor material from the plurality of semiconductor chips to make each semiconductor chip thinner; and
   coupling a heatsink to the plurality of semiconductor chips.

2. The method for forming a multiple chip package with thinned semiconductor chips of claim 1 wherein the forming a gold bump step includes:
   forming a gold surface on each contact pad on each semiconductor chip;
   using photoresist to mask off areas surrounding each contact pad on each semiconductor chip;
   forming the gold bump on each contact pad of each semiconductor chip by electroplating; and
   removing photoresist from each semiconductor chip or from the substrate.

3. The method for forming a multiple chip package with thinned semiconductor chips of claim 1 wherein the providing a substrate step includes:
   forming the substrate from aluminum oxide, wherein the aluminum oxide substrate has metal interconnect;
   forming a gold surface on the corresponding substrate contact pads;
   forming a plurality of metal plated openings through the substrate, wherein the metal plated openings allow electrical connection to the substrate from a side opposite from which the plurality of semiconductor chips are mounted; and
   placing a plurality of metal stops on the substrate, wherein the plurality of metal stops are used in the removal of material from the plurality of semiconductor chips.

4. The method for forming a multiple chip, package with thinned semiconductor chips of claim 1 wherein the coupling each semiconductor step includes:
   heating the plurality of semiconductor chips and the substrate to heat each gold bump to bond to each contact pad.

5. The method for forming a multiple chip package with thinned semiconductor chips of claim I wherein the placing an encapsulation material step includes:
   using epoxy as the encapsulating material.

6. The method for forming a multiple chip package with thinned semiconductor chips of claim 1 wherein the removing material from the plurality of semiconductor chip step includes:
   using a grinding disk to remove material from the plurality of semiconductor chips wherein material is removed from the plurality of semiconductor chips simultaneously to thin each semiconductor chip a substantially similar amount.

7. The method for forming a multiple chip package with thinned semiconductor chips of claim 1 wherein the coupling a heatsink step includes:
   forming the heatsink of copper;
   placing a thermal conducting means on the plurality of semiconductor chips; and
   attaching the heatsink on the thermal conducting means.

8. A method for forming a semiconductor chip package comprising;
   forming an assembly comprising a plurality of semiconductor chips coupled to a substrate;
   placing an encapsulation material on the substrate to surround the semiconductor chips while leaving a backside of the semiconductor chips exposed;
   placing a plurality of metal stops on the substrate wherein the metal stops are placed on the substrate as a final semiconductor chip height indicator;
   grinding the assembly using a grinding disk to remove material form the backside of the plurality of semiconductor chips; and
   attaching a heat sink to the back side of the plurality of semiconductor chips.

9. The method for forming a semiconductor chip package of claim 8 wherein the forming an assembly step includes:
   providing a plurality of contact pads on each semiconductor chip and forming a corresponding plurality of substrate contact pads for each semiconductor chip on the substrate, wherein the contact pads and the corresponding substrate contact pads have a gold surface;

forming a metal bump on each contact pad of each semiconductor chip wherein the metal bump is formed of gold; and coupling the plurality of contact pads on each semiconductor chip and the corresponding plurality of substrate contact pads on the substrate wherein the metal bump on each contact pad of each semiconductor chip forms a physical and electrical bond to a corresponding substrate contact pad.

10. The method for forming a semiconductor chip package of claim 9 wherein the forming an assembly step includes:

providing a plurality of contact pads on each semiconductor chip and forming a corresponding plurality of substrate contact pads for each semiconductor chip on the substrate, wherein the contact pads and the corresponding substrate contact pads have a gold surface;

forming a metal bump on each corresponding substrate contact pad on the substrate, wherein the metal bump is formed of gold; and coupling the plurality of contact pads on each semiconductor chip and the corresponding plurality of substrate contact pads on the substrate wherein the metal bump on each corresponding substrate contact pad on the substrate forms a physical and electrical bond to a corresponding contact pad on a semiconductor chip.

11. The method for forming a semiconductor chip package of claim 8 wherein the forming the assembly step and the placing an encapsulation material step includes using epoxy as the encapsulation material.

12. The method for forming a semiconductor chip package of claim 8 wherein the attaching a heatsink step includes:

placing a thermal conductive material on the back side of the plurality of semiconductor chips;

forming the heatsink from copper;

placing the heatsink on the thermal conductive material; and fastening the heatsink to the assembly.

13. A method for forming a semiconductor package having a plurality of thinned semiconductor chips to promote heat dissipation comprising:

providing a plurality of semiconductor chips;

providing a substrate for mounting the plurality of semiconductor chips, said substrate having a plurality of metal plated holes for providing electrical interconnect to either side of the substrate;

coupling the plurality of semiconductor chips to a surface of the substrate, wherein circuitry on each semiconductor chip faces the substrate leaving a backside of each semiconductor chip exposed;

placing an encapsulation material on the surface of the substrate wherein the encapsulation material surrounds the semiconductor chips and protects the surface of the substrate;

removing material from the backside of the plurality of semiconductor chips, wherein the plurality of semiconductor chips are thinned to promote heat dissipation; and coupling the heat sink to the back side of the plurality of semiconductor chips for removing heat.

14. The method for forming a semiconductor package having a plurality of thinned semiconductor chips to promote heat dissipation of claim 13 wherein the providing the substrate step includes:

forming the substrate from aluminum oxide; and placing a plurality of metal stops on the substrate wherein the plurality of metal stops indicate when a correct amount of material has been removed from the backside of the semiconductor chips.

15. The method for forming a semiconductor package having a plurality of thinned semiconductor chips to promote heat dissipation of claim 13 wherein the coupling the plurality of semiconductor chips to a surface of the substrate step includes:

forming a plurality of contact pads on each semiconductor chip;

forming a corresponding plurality of substrate contact pads for each semiconductor chip on the substrate;

forming a coupling means on each contact pad of each semiconductor chip; and coupling each semiconductor chip to the substrate wherein each contact pad on each semiconductor chip is bonded to a corresponding substrate contact pad by the coupling means.

16. The method for forming a semiconductor package having a plurality of thinned semiconductor chips to promote heat dissipation of claim 13 wherein the coupling the plurality of semiconductor chips to a surface of the substrate step includes:

forming a plurality of contact pads on each semiconductor chip;

forming a corresponding plurality of substrate contact pads for each semiconductor chip on the substrate;

forming a coupling means on each corresponding substrate contact pad on the substrate; and coupling each semiconductor chip to the substrate wherein each contact pad on each semiconductor chip is bonded to a corresponding substrate contact pad by the coupling means.

17. The method for forming a semiconductor package having a plurality of thinned semiconductor chips to promote heat dissipation of claim 13 wherein the placing an encapsulation material step includes:

choosing encapsulating material as an epoxy wherein the epoxy prevents the surface of the substrate from exposure to an external environment.

18. The method for forming a semiconductor package having a plurality of thinned semiconductor chips to promote heat dissipation of claim 13 wherein the removing material step includes:

thinning the backside of the plurality of semiconductor chips with a grinding disk.

19. The method for forming a semiconductor package having a plurality of thinned semiconductor chips to promote heat dissipation of claim 13 further including:

coupling the backside of the semiconductor chips to a heatsink.

20. The method for forming a semiconductor package having a plurality of thinned semiconductor chips to promote heat dissipation of claim 19 wherein the coupling the backside of the semiconductor chips step includes:

placing a thermal conductive material on the backside of the semiconductor chips to insure uniform coupling to a heatsink; and placing a heatsink on the thermal conductive material, wherein the heatsink is made of copper; and fastening the heatsink to the substrate.

* * * * *